(12) United States Patent
Yoon et al.

(10) Patent No.: US 11,605,560 B2
(45) Date of Patent: Mar. 14, 2023

(54) DIE DIVISION METHOD AND INSPECTION APPARATUS FOR AVOIDING DEFECTS LOCATIONS ON SILICON CARBIDE WAFERS

(71) Applicant: ETAMAX CO., LTD, Suwon-si (KR)

(72) Inventors: Jongho Yoon, Gunpo-si (KR); Min Park, Suwon-si (KR)

(73) Assignee: ETAMAX CO., LTD, Suwon-si (KR)

( * ) Notice: Subject to any disclaimer, the term of this patent is extended or adjusted under 35 U.S.C. 154(b) by 186 days.

(21) Appl. No.: 17/148,082

(22) Filed: Jan. 13, 2021

(65) Prior Publication Data
US 2022/0199470 A1   Jun. 23, 2022

(30) Foreign Application Priority Data
Dec. 21, 2020 (KR) .................. 10-2020-0179558

(51) Int. Cl.
*H01L 21/78* (2006.01)
*H01L 21/67* (2006.01)
*H01L 21/02* (2006.01)

(52) U.S. Cl.
CPC ........ *H01L 21/78* (2013.01); *H01L 21/02378* (2013.01); *H01L 21/67259* (2013.01); *H01L 21/67288* (2013.01)

(58) Field of Classification Search
CPC .............. H01L 21/78; H01L 21/02378; H01L 21/67259; H01L 21/67288; H01L 22/12; G01N 21/9501; G01N 2021/646; G01N 2021/8848; G01N 2021/8861; G01N 21/6489; G01N 21/9505
See application file for complete search history.

(56) References Cited

U.S. PATENT DOCUMENTS

| | | | | |
|---|---|---|---|---|
| 8,340,395 | B2 * | 12/2012 | Sakai | G06K 9/6284 382/149 |
| 9,093,518 | B1 * | 7/2015 | Lei | H01L 24/92 |
| 9,165,832 | B1 * | 10/2015 | Papanu | H01L 21/67207 |
| 10,665,321 | B2 * | 5/2020 | Wang | G11C 29/56016 |
| 2005/0067391 | A1 * | 3/2005 | Starkston | B23K 26/40 219/121.72 |
| 2005/0214956 | A1 * | 9/2005 | Li | G01N 25/18 438/14 |
| 2021/0193524 | A1 * | 6/2021 | Kamphuis | H01L 22/32 |

FOREIGN PATENT DOCUMENTS

EP  3754694 A1 * 12/2020 ........... H01L 21/304

* cited by examiner

*Primary Examiner* — Mohammed Shamsuzzaman
(74) *Attorney, Agent, or Firm* — Knobbe, Martens, Olson & Bear, LLP

(57) ABSTRACT

The present invention relates to defects inspection on a silicon carbide wafer or an epitaxial layer thereon to determine the location, and adjustment of the location of the scribe line, which is a separation line forming a gap between adjacent dies. The present invention can obtain high efficiency and economy in the semiconductor process using wafers containing various defects in the surface and thin film, by minimizing the effect of wafer defects on the final yield of the semiconductor chip or die, via adjustment of scribe line positions arranged on the wafer.

6 Claims, 13 Drawing Sheets

(a)

(b)

(a) (b)

(a)

(b)

DIE DIVISION METHOD AND INSPECTION APPARATUS FOR AVOIDING DEFECTS LOCATIONS ON SILICON CARBIDE WAFERS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

TECHNICAL FIELD

The present disclosure relates to a method of dividing a plurality of dies formed on a silicon carbide wafer or an epitaxial layer on a silicon carbide wafer, which is mainly used for manufacturing a power device.

BACKGROUND ART

Semiconductor devices are manufactured by repeatedly performing unit processes such as etching, deposition, exposure, cleaning, and inspection on the wafer surface represented by silicon. Defects on the wafer that may occur when performing a unit process cause a decrease in the manufacturing yield of a semiconductor device. As the integration of semiconductor devices is advanced, the size of defects causing serious defects is also becoming smaller. Therefore, in order to minimize the occurrence of defects during the semiconductor device manufacturing process, it is necessary to quickly and accurately inspect fine defects.

However, in wafers that manufacture specific semiconductor devices such as high-power silicon carbide (SiC) electric devices, aluminum nitride (AlN) ultraviolet LEDs, and gallium nitride (GaN) ultra-high intensity LEDs, defects generated in the process of forming single crystals are unevenly distributed. As a result, it affects the epitaxial layer formed thereon, and if a chip is formed at such a defect location, it often becomes a defective device that does not operate properly.

Various attempts have been made to minimize the phenomenon that wafer defects lead to device defects. Korean Patent Registration No. KR 10-1536767 relates to a method of defect selective covering on the surface of semiconductor substrate, and discloses a technique for a defect covering method for generating a semiconductor substrate in which surface defects are filled with a masking material. However, the method shows inefficiency and requires high cost of repeatedly growing the substrate by creating a new layer on the substrate. The disclosure of this section is to provide background information relating to the present disclosure. Applicant does not admit that any information contained in this section constitutes prior art.

SUMMARY

Aspects of the present invention allows defects identified on the surface of a silicon carbide wafer or epitaxial layer formed on the wafer to affect only a minimum number of dies processed thereon. Aspects of the present invention is to provide a division method and an inspection apparatus that inspects defects and determines die divisions that maximize the number of dies distributed avoiding the locations of identified surface defects. Aspects of the present invention relates to defects are inspected on a silicon carbide wafer or an epitaxial layer thereon to determine the location, and then the location of the scribe line, which is a separation line forming a gap between adjacent dies, is adjusted, the present invention relates to a die dividing method and an inspection apparatus for maximizing the number of dies avoiding defects in wafers.

One aspect of the present invention provides a defect avoiding die division method that detects defects on the surface of a silicon carbide wafer or an epitaxial layer formed on a silicon carbide wafer, and determines a die section to maximize the number of dies distributed to avoid the detected surface defects, the defect avoiding die division method comprises: preparing a silicon carbide wafer and setting a coordinate reference point on the surface of the wafer; displaying an image defects as the surface defect coordinate information, which is the location information of the surface defect of the wafer to the coordinate reference point of the wafer, incident light having a predetermined cross-sectional bam size and wavelength is scanned onto the wafer surface to detect a reflected light reflected from the wafer surface, and the image defects are identified from the detected reflected light; and comprising moving a lattice-shaped virtual scribe line dividing the die on the surface of the wafer in a plane, and adjusting the number of dies not placed at the surface defect location to be maximized.

One aspect of the present invention also provides a defect avoiding die division method, wherein the displaying the surface defect coordinate information further comprises detecting photoluminescence generated by scanning the incident light onto the wafer surface, identifying PL defect in the detected photoluminescence and displaying it in the surface defect information.

One aspect of the present invention also provides a defect avoiding die division method, wherein the incident light is a laser light having an energy greater than the band gap energy of the silicon carbide.

One aspect of the present invention also provides a defect avoiding die division method, wherein the incident light is composed of two incident light in a vertical and oblique direction to the wafer surface respectively, and wherein the method further comprises detecting a reflected light reflected from the wafer surface and identifying scattering defect in the detected reflected light.

One aspect of the present invention also provides a defect avoiding die division method, wherein the moving a lattice-shaped virtual scribe line dividing the die on the surface of the wafer in a plane for adjusting the number of dies not placed at the surface defect location to be maximized, further comprises: displaying a position of a virtually displayed scribe line at which the number of dies divided on the wafer is maximized as an origin; setting the number of dies not placed at the surface defect position as the origin value when the virtually displayed scribe line is at the origin; comparing the number of dies not placed at the surface defect location with the origin value with moving the virtually displayed scribe line to a predetermined range based on the origin value with respect to the surface defect coordinate information; and determining a position, where the number of dies not placed at the surface defect position is maximum through the comparison, as the position of the scribe line.

One aspect of the present invention also provides a defect avoiding die division method, wherein the moving direction is x and y directions, which are horizontal and vertical directions of the die, and the predetermined range is a horizontal length of one die in the x direction, and a vertical length of one die in the y direction.

One aspect of the present invention also provides a defect avoiding die division method, wherein the predetermined range is a horizontal length of one die in the x direction, and a vertical length of one die in the y direction.

One aspect of the present invention also provides a defect avoiding die division method, wherein the coordinate reference point is determined as the center position of the flat zone of the wafer, and the die dividing position is determined as a scribe line position, where the number of dies not placed at the surface defect location is maximized.

One aspect of the present invention also provides an inspection apparatus for avoiding defects locations on wafer that detects defects on the surface of a silicon carbide wafer or an epitaxial layer formed on a silicon carbide wafer and determines die section to maximize the number of dies distributed to avoid the detected surface defects, the inspection apparatus for avoiding defects locations on wafer comprises: a wafer stage for loading by setting a coordinate reference point on a surface of a silicon carbide wafer; an incident light source for incidence of incident light to the wafer surface, having a predetermined beam cross-sectional size and wavelength; a wafer stage that sets and loads a coordinate reference point on the surface of the wafer so that the incident light is scanned along a trajectory on the surface of the silicon carbide wafer and moves in two or more axes; a light condensing unit comprising a band pass filter for condensing and passing reflected light reflected from the wafer surface; a detection unit for detecting reflected light passing through the condensing unit; and a control unit for displaying an image defects as the surface defect coordinate information which is the location information of the surface defect of the wafer to the coordinate reference point of the wafer with identification of an image defect from the reflected light detected by the detection unit, for forming a lattice-shaped virtual scribe line dividing the die on the surface of the wafer, and for adjusting the number of dies not placed at the surface defect location to be maximized.

One aspect of the present invention also provides an inspection apparatus for avoiding defects locations on wafer, wherein the condensing unit further comprises a bandpass filter for condensing and passing photoluminescence generated from the wafer, the detection unit further comprises a photoluminescence detector, the control unit further displays a PL defects as the surface defect coordinate information, which is the location information of the surface defect of the wafer to the coordinate reference point of the wafer, after identification of the PL defect from the photoluminescence detected by the detection unit.

One aspect of the present invention also provides an inspection apparatus for avoiding defects locations on wafer, wherein the incident light is a laser light having an energy greater than the band gap energy of the silicon carbide.

One aspect of the present invention also provides an inspection apparatus for avoiding defects locations on wafer, wherein the incident light source unit is composed of two incident lights each incident on the wafer surface in a vertical and oblique direction, the detection unit further comprises a scattered light detector for detecting the scattered light scattered from the wafer surface, the control unit further displays a scattered light image defects as the surface defect coordinate information, which is the location information of the surface defect of the wafer to the coordinate reference point of the wafer, after identification of the scattered image defects from the scattered light detected by the detection unit.

One aspect of the present invention also provides an inspection apparatus for avoiding defects locations on wafer, wherein the control unit comprises a computer-operable program for maximizing the number of dies divided by the scribe line not placed at the surface defect position, the program comprises: operation of displaying a position of a virtually displayed scribe line at which the number of dies divided on the wafer is maximized as an origin; operation of setting the number of dies not placed at the surface defect position as the origin value when the virtually displayed scribe line is at the origin; operation of comparing the number of dies not placed at the surface defect location with the origin value with moving the virtually displayed scribe line to a predetermined range based on the origin value with respect to the surface defect coordinate information; and operation of determining a position, where the number of dies not placed at the surface defect position is maximum through the comparison, as the position of the scribe line.

One aspect of the present invention also provides an inspection apparatus for avoiding defects locations on wafer, wherein the control unit comprises a computer-operable program for maximizing the number of dies divided by the scribe line not placed at the surface defect position, the program comprises: operation of displaying a position of a virtually displayed scribe line at which the number of dies divided on the wafer is maximized as an origin; operation of setting the number of dies not placed at the surface defect position as the origin value when the virtually displayed scribe line is at the origin; operation of comparing the number of dies not placed at the surface defect location with the origin value with moving the virtually displayed scribe line to a predetermined range based on the origin value with respect to the surface defect coordinate information; and operation of determining a position, where the number of dies not placed at the surface defect position is maximum through the comparison, as the position of the scribe line.

One aspect of the present invention also provides an inspection apparatus for avoiding defects locations on wafer, wherein the moving direction is x and y directions, which are horizontal and vertical directions of the die, and the predetermined range is a horizontal length of one die in the x direction, and a vertical length of one die in the y direction.

One aspect of the present invention also provides an inspection apparatus for avoiding defects locations on wafer, wherein the coordinate reference point is determined as the center position of the flat zone of the wafer, and the die dividing position is determined as a scribe line position, where the number of dies not placed at the surface defect location is maximized.

One aspect of the present invention also provides an inspection apparatus for avoiding defects locations on wafer, wherein the control unit is capable of outputting the adjusted scribe line information to an information storage device or a wired/wireless information transmission device to deliver to a subsequent semiconductor processing equipment, and the adjusted scribe line information is the number of dies not placed at the surface defect location is maximized.

One aspect of the present invention also provides an inspection apparatus for avoiding defects locations on wafer, wherein the incident light of the incident light source has a polarization characteristic, wherein in the apparatus, a differential interference prism is further inserted in the path before the incident light passes through the objective lens for incidence of the incident light onto the wafer surface, and a polarizer is further arranged on the path in front of the detection unit.

One aspect of the present invention also provides an inspection apparatus for avoiding defects locations on wafer, wherein the condensing unit further comprises a variable angle spectroscopic mirror, and the detection unit further comprises a spectroscopic detector.

Die division method and inspection apparatus avoiding defects locations on silicon carbide wafers according to embodiments of the present invention can obtain high efficiency and economy in the semiconductor process using wafers containing various defects in the surface and thin film, by minimizing the effect of wafer defects on the final yield of the semiconductor chip or die, via adjustment of scribe line positions arranged on the wafer.

DETAILED DESCRIPTION OF EMBODIMENTS

Figure 1:
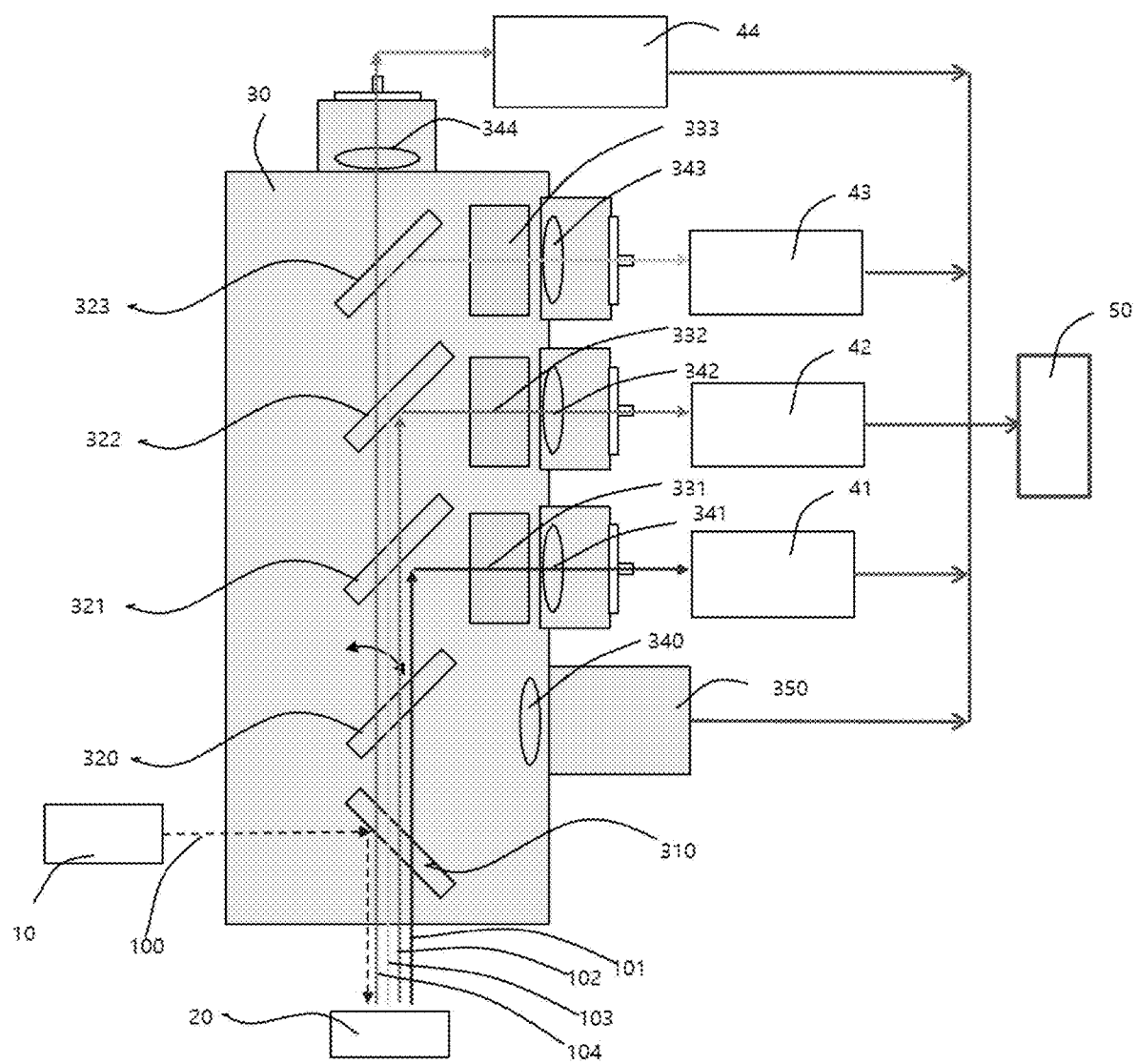
FIG. 1 is a schematic diagram of an inspection apparatus for avoiding defects locations on wafer, according to one embodiment of the present invention, that detects defects on the surface of a silicon carbide wafer or an epitaxial layer formed on a silicon carbide wafer and determines die section to maximize the number of dies distributed to avoid the detected surface defects.

Prior to the description of embodiments of the invention, the terms or words used in the specification and claims described below should not be construed as limiting in their usual or dictionary meanings. Therefore, the embodiments described in the specification and the drawings shown in the drawings are only example embodiments of the present invention and do not represent all of the technical idea of the present invention. It should be understood that there might be variations and various equivalents that may be substituted for them at the time of the present application.

In embodiments of the present invention, crystalline defects such as stacking faults (SF) and a basal plane dislocations (BPD) existing in each layer of a silicon carbide (SiC)-based semiconductor device are excited by ultraviolet light. The reflected light, scattered light and specific photoluminescence are generated during the excitation and utilized. Specifically, a method and apparatus for minimizing the influence of the surface defect on a chip or die as a result of a process by defining various defects present in a silicon carbide wafer and an epitaxial layer formed on the silicon carbide wafer as surface defects are disclosed.

FIG. 1 is a schematic diagram of an inspection apparatus for avoiding defects locations on wafer, according to one embodiment of the present invention, that detects defects on the surface of a silicon carbide wafer or an epitaxial layer formed on a silicon carbide wafer and determines die section to maximize the number of dies distributed to avoid the detected surface defects. In one embodiment of the present invention, the inspection apparatus for avoiding defects locations on wafer comprises: a sample stage assembly 20 capable of fixing the silicon carbide substrate and movable in position so that incident light scans the substrate surface; An incident light source unit 10 that is incident on the surface of the silicon carbide wafer and emits incident light 100 generating photoluminescence together with reflected light and scattered light; A light condensing unit 30 configured to collect a plurality of generated light generated from the surface of the silicon carbide substrate, classify by wavelength, and emit it to a plurality of channels having different positions; A plurality of detection units (41, 42, 43, 44) arranged for each channel to detect reflected light, scattered light, and photoluminescence emitted for each channel having different positions formed in the multi-channel unit; It is communicatively coupled with the plurality of detection units to obtain surface defect information comprising stacking defects on the silicon carbide surface from reflected light, scattered light, and photoluminescence detected by each detection unit, and the sample stage assembly, the incident light source unit, And a control unit 50 for controlling the light condensing unit and the detection unit.

In embodiments of the present invention, the detection unit may be adjustable to detect specific wavelengths of reflected light, scattered light, and photoluminescence, and in one embodiment of the present invention, the incident light may be adjusted to be vertically incident. The incident light 100 of the incident light source unit may be selected as ultraviolet rays from the surface of a sample incident vertically. As the incident ultraviolet light source, laser light, in particular, a laser having a continuous wave may be used, but is not limited thereto. In addition, in one embodiment of the present invention, reflected light, scattered light, and photoluminescence generated on the surface of the sample may be selectively detected by a photodetector responding to a specific wavelength. In light path incident light emitted from the incident light source is incident on the sample, and those of generated reflected light, scattered light and photoluminescence from the sample are detected by the photo detectors. Various types of optical devices or elements such as lenses, mirrors, filters, etc. may be added in the light path.

In one embodiment of the present invention, the light condensing unit comprises color sorting mirror 310 which reflects the incident light 100 to be vertically incident on the surface of the silicon carbide wafer mounted on the sample stage, and passes reflected light, scattered light and photoluminescence. The reflected light, the scattered light and the photoluminescence are generated on the surface of the wafer and directing along a vertical direction of the wafer surface. The light condensing unit also comprises plurality of color sorting mirrors 310, 321, 322, 323 having different reflection wavelength bands which is sequentially positioned along the traveling direction of the wafer surface generated light 101, 102, 103, 104 having different wavelengths that have passed through the color sorting mirror 310. The plurality of color sorting mirrors proceeds the generated light in a predetermined direction. The light condensing unit also comprises plurality of channels respectively positioned in paths of light having different reflection wavelength bands, which are reflected by the plurality of color selection mirrors and respectively proceed in the predetermined direction; and a plurality of band pass filters 331, 332, 333, 334 corresponding to different reflection wavelength bands incident on the plurality of channels. In one embodiment of the present invention, a plurality of light detectors 41, 42, 43, 44 correspond to the plurality of channels, respectively. In one embodiment of the present invention, lenses (341, 342, 343,344) may be located for focusing reflected light, scattered light, or photoluminescence between the band-pass filter and the channel, or at a front portion of the channel on a path of the light.

In one embodiment of the present invention, on the generated light path between the incident light selective reflection mirror of the multi-channel unit and a first color sorting mirror among the plurality of color sorting mirrors, for observing a spectroscopic image of a sample mounted on the sample stage assembly. A reflective mirror 320 and a spectroscopic detector 350 having a variable angle spectroscopic mirror characteristic may be further comprised. In one embodiment of the present invention, a lens 340 may be positioned in the optical path toward the spectroscopic detector 350. In one embodiment of the present invention, the detection unit may be a photomultiplier tube (PMT), or a monochromator system imbedded photomultiplier tube. A method performed by the control unit 50 of the inspection apparatus will be described in detail below.

Figure 2:
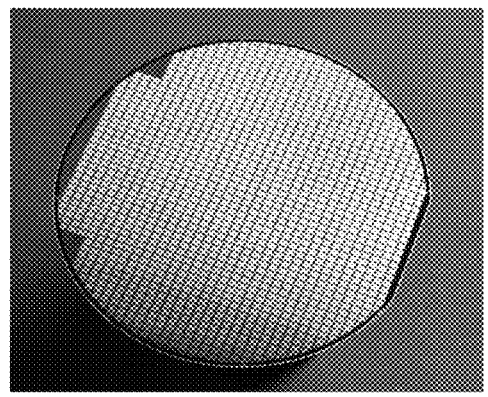
FIG. 2 is a conceptual diagram illustrating a die divided by a scribe line on a silicon carbide wafer and a scribe line, which is a physical separation line forming a gap between adjacent dies.
Figure 2:
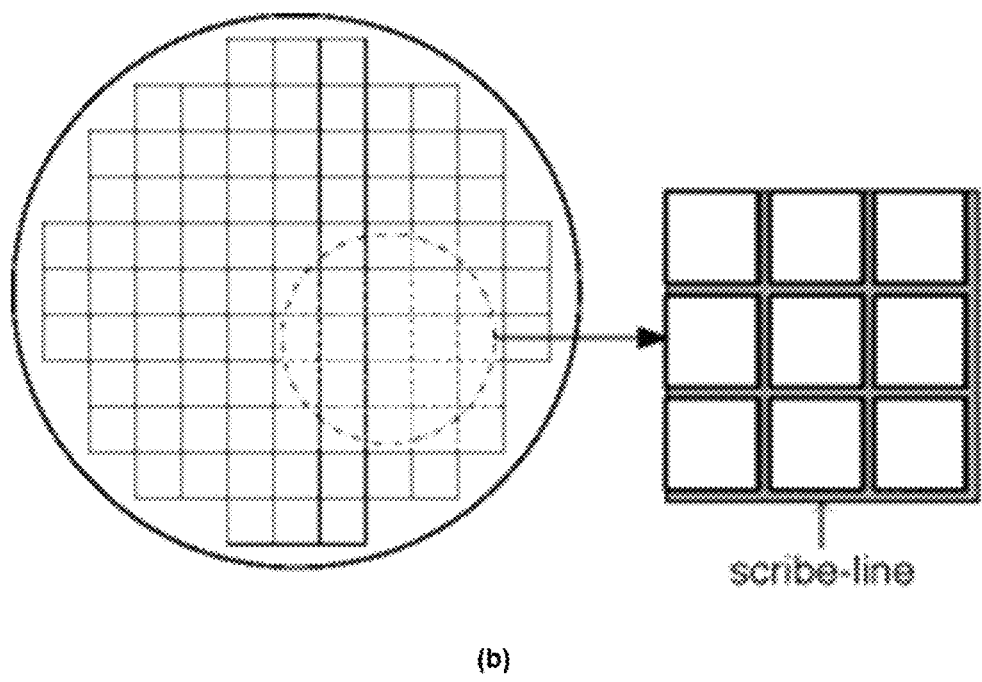

FIG. 2 is a conceptual diagram showing a view of a wafer distribution picture (a) of a die divided by a scribe line on a silicon carbide wafer and an enlarged scribe line (b), which is a physical separation line forming a gap between adjacent dies. In general, a flat zone for position identification exists in a round wafer, and a small square die is formed so that one side of the die is formed in a direction parallel to the flat zone. Electronic circuits are integrated on the die, and each die is made of one IC chip. There is a scribe line, which is a physical separation line that forms a gap between one die and an adjacent die, and acts as a separator for separating the dies using a diamond saw after processing. In one example, the scribe line may be set so that as many dies as possible exist in the entire area of the wafer excluding the corner area, and a small device for inspecting the process is formed in some scribe line sections.

Figure 3:
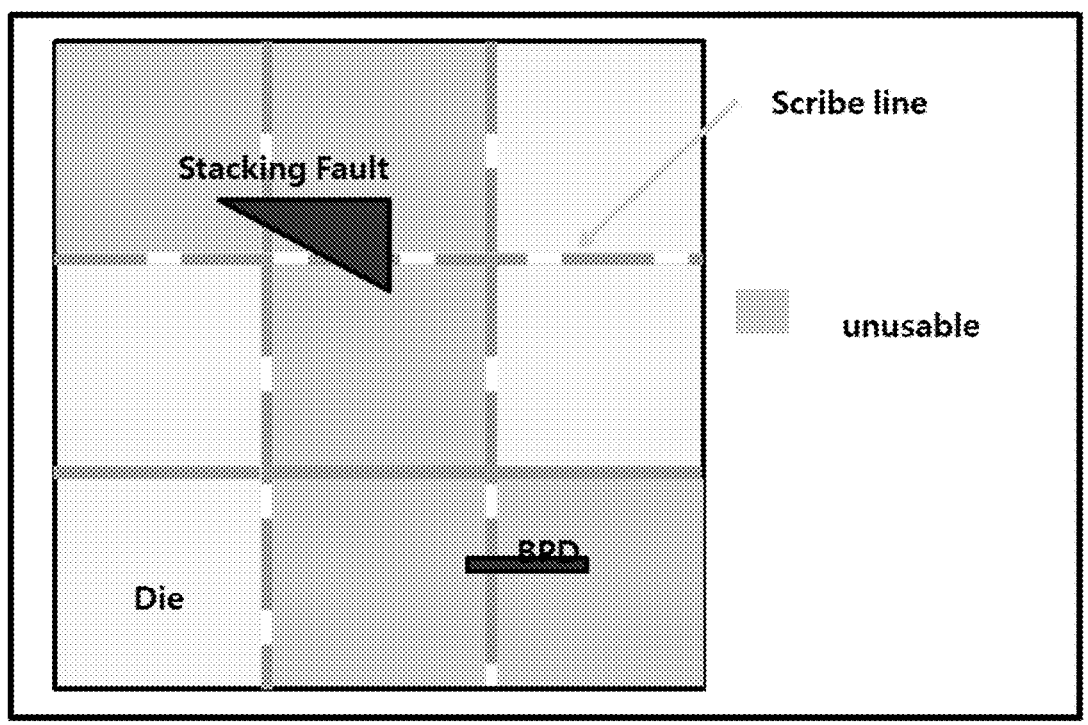
FIG. 3 is a conceptual diagram showing various surface defects detected on the surface of a silicon carbide wafer or an epitaxial layer formed on a silicon carbide wafer, and dies not placed on the surface defects.

FIG. 3 is a conceptual diagram showing various surface defects such as Basal Plane Dislocation (BPD) and Stacking Faults (SF) detected on the surface of a silicon carbide wafer or an epitaxial layer formed on a silicon carbide wafer, and dies not placed on the surface defects. In one example, a scribe line may be set in consideration of only the maximum number of dies that can be obtained from a wafer, which is a natural process for obtaining the maximum number of dies or chips to be operated. However, in the case of silicon carbide, various types of surface defects are formed on the wafer and the epitaxial layer forming wafer that is put into the actual process, and there are cases in which several dies are placed thereon. This is also the effect of decreasing the size of the die or chip as the degree of integration of the semiconductor increases. Since dies on top of surface defects are not normally working chips, when multiple dies are placed on top of surface defects, the process yield can be improved by just moving the position.

Figure 4:
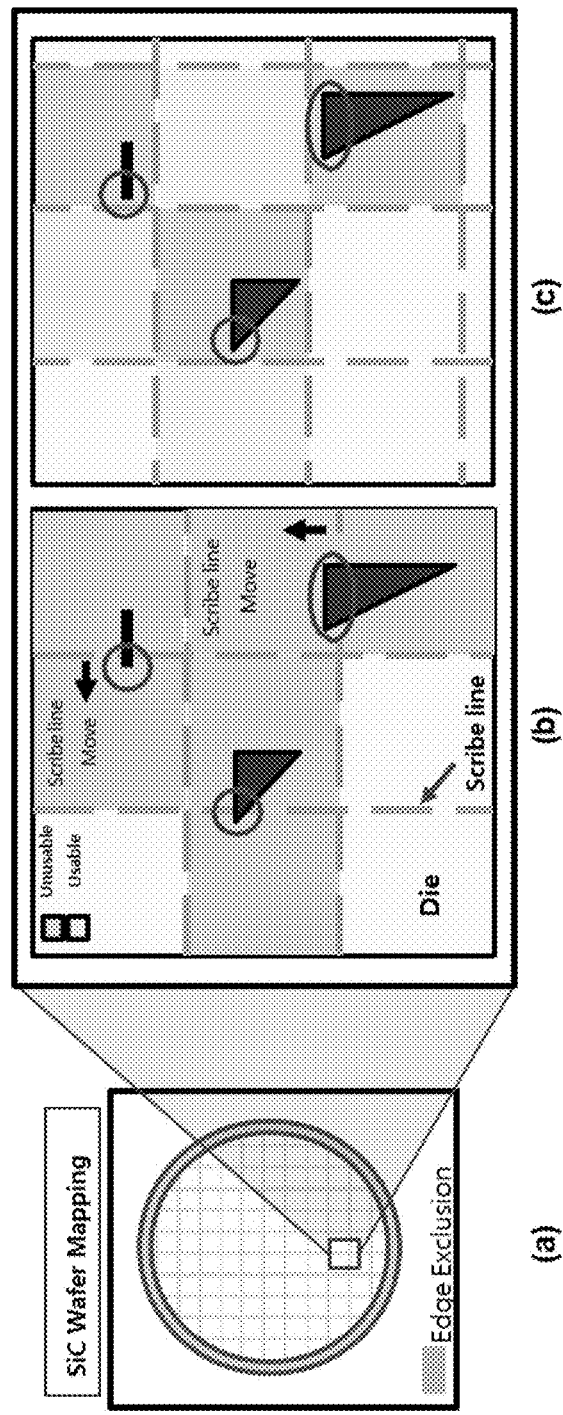
FIG. 4 is a conceptual diagram of determining a die section to maximize the number of dies that are not placed at the locations of detected surface defects according to one embodiment of the present invention.

FIG. 4 is a conceptual diagram of determining a die section to maximize the number of dies that are not placed at the locations of detected surface defects on the wafer (a) from the initial state (b) to the position movement (c) of the scribe line according to an embodiment of the present invention. In one embodiment of the present invention, the partition minimizes the number of dies lost due to wafer defects in consideration of the thickness of the scribe line and the wafer surface defect. In one embodiment of the present invention, the defect avoiding die division method comprises: preparing a silicon carbide wafer and setting a coordinate reference point on the surface of the wafer; displaying an image defects as the surface defect coordinate information, which is the location information of the surface defect of the wafer to the coordinate reference point of the wafer, incident light having a predetermined cross-sectional bam size and wavelength is scanned onto the wafer surface to detect a reflected light reflected from the wafer surface, and the image defects are identified from the detected reflected light; and comprising moving a lattice-shaped virtual scribe line partitioning the die on the surface of the wafer in a plane, and adjusting the number of dies not placed at the surface defect location to be maximized. In one embodiment of the present invention, the surface defect may be an image defect identified by reflected light.

In one embodiment of the present invention, the surface defect comprises an image defect identified by reflected light and a PL defect identified by photoluminescence. To this end, the displaying the surface defect coordinate information further comprises detecting photoluminescence generated by scanning the incident light onto the wafer surface, identifying PL defect in the detected photoluminescence and displaying it in the surface defect information. In one embodiment of the present invention, in order to obtain photoluminescence, the incident light is a laser light having an energy greater than the bandgap energy of the silicon carbide, and may have a wavelength of, for example, 355 nm. Among the photoluminescence generated by the incident light of 355 nm, a detection wavelength may be 390 nm. In another embodiment of the present invention, the image defect can be confirmed by detecting reflected light and scattered light together, or by detecting only scattered light. Therefore, the surface defect can be obtained by adding an image defect obtained by reflected light and/or scattered light alone or by adding the image defect and a PL defect obtained by photoluminescence. To this end, the incident light is composed of two incident light in a vertical and oblique direction to the wafer surface respectively, and wherein the method further comprises detecting a reflected light reflected from the wafer surface and identifying scattering defect in the detected reflected light.

Figure 5:
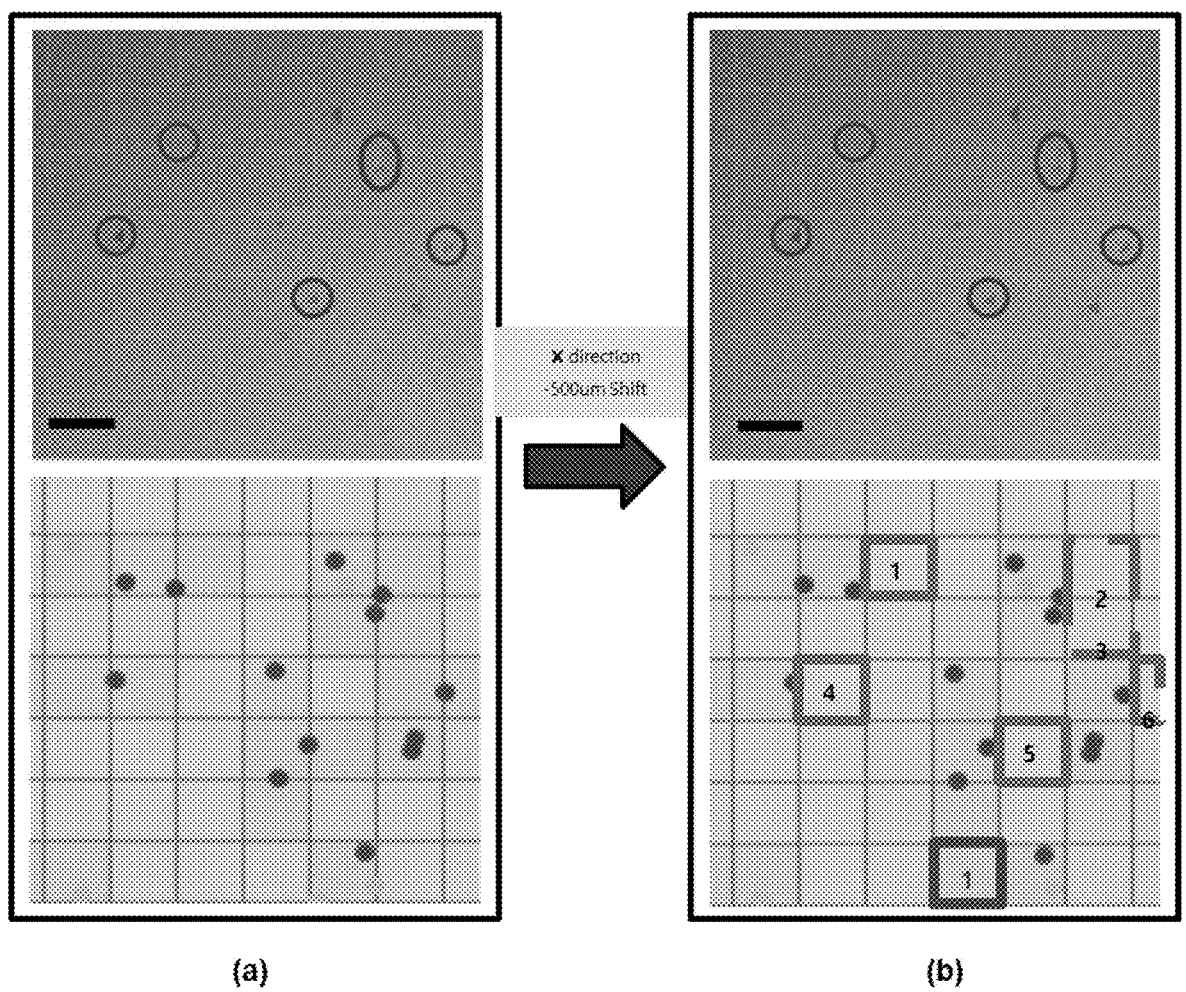
FIG. 5 is a conceptual diagram illustrating a change in the number of dies placed on a surface defect when a die section is moved to maximize the number of dies not placed at a position of detected surface defects according to an embodiment of the present invention.

FIG. 5 is a conceptual diagram illustrating a change in the number of dies placed on a surface defect when a die section is moved from the origin (a) to a location 500 micrometers away in the −x direction (b) to maximize the number of dies not placed at a position of detected surface defects, according to an embodiment of the present invention. In this case, the number of dies out of the defect position is 6, and since there is only one die newly placed at the defect position, all five dies have the effect of leaving the defect position.

Figure 6:
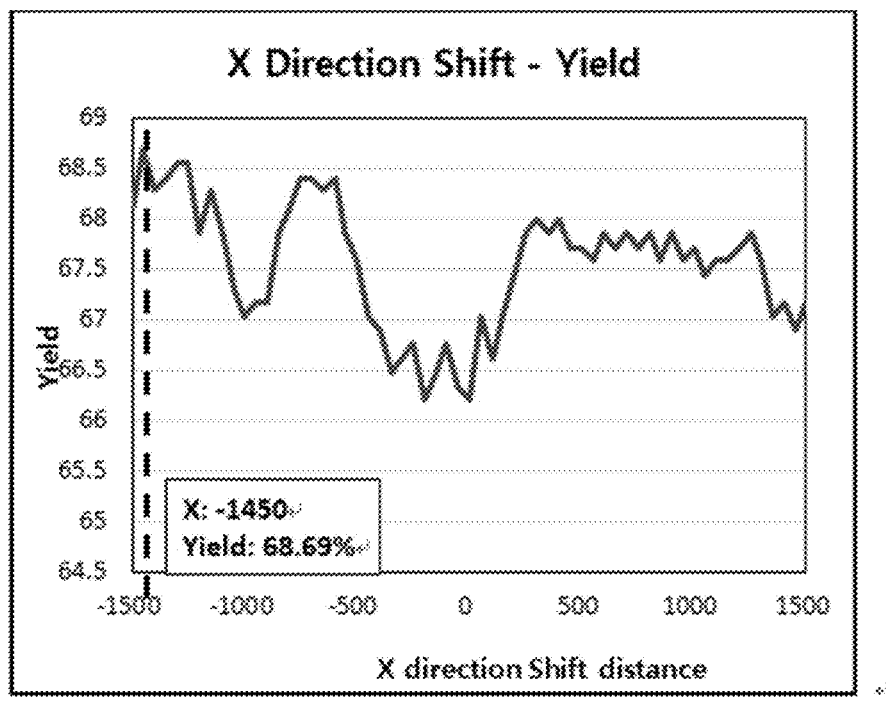
FIG. 6 is a graph showing the change in the number of dies from the observed surface defects while moving the scribe lines in the x and y directions, respectively, as the horizontal and vertical directions of the die according to an embodiment of the present invention.
Figure 6:
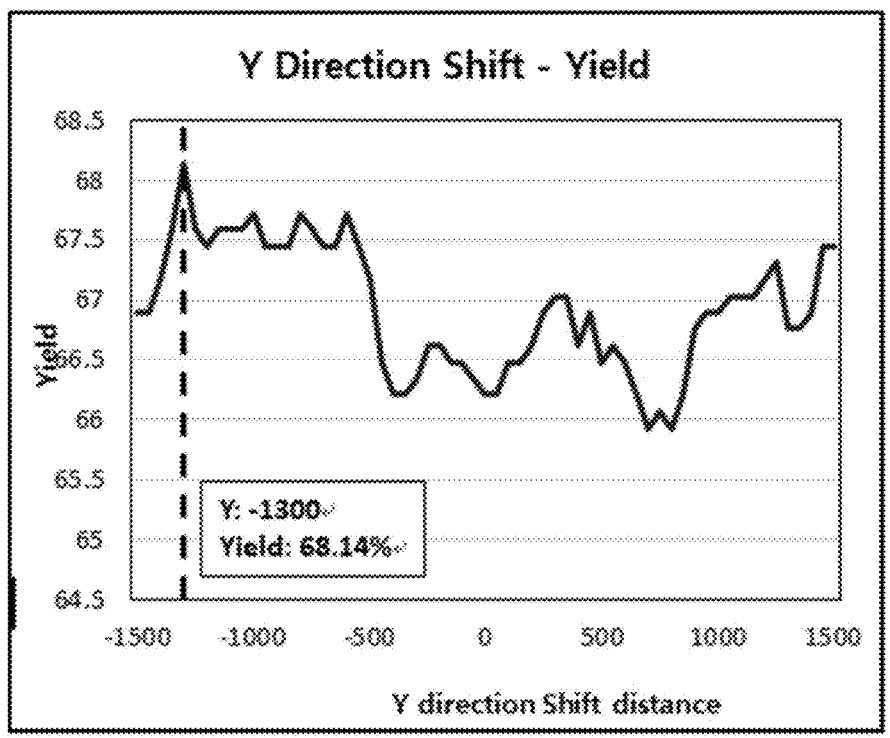

FIG. 6 is a graph showing the change in the number of dies from the observed surface defects while moving the scribe lines in the x and y directions, respectively, as the horizontal and vertical directions of the die according to an embodiment of the present invention. In one embodiment of the present invention, a value having the largest total number of dies that escape from surface defects while moving in both axes is found. Hereinafter, the specific method will be described.

Figure 7:
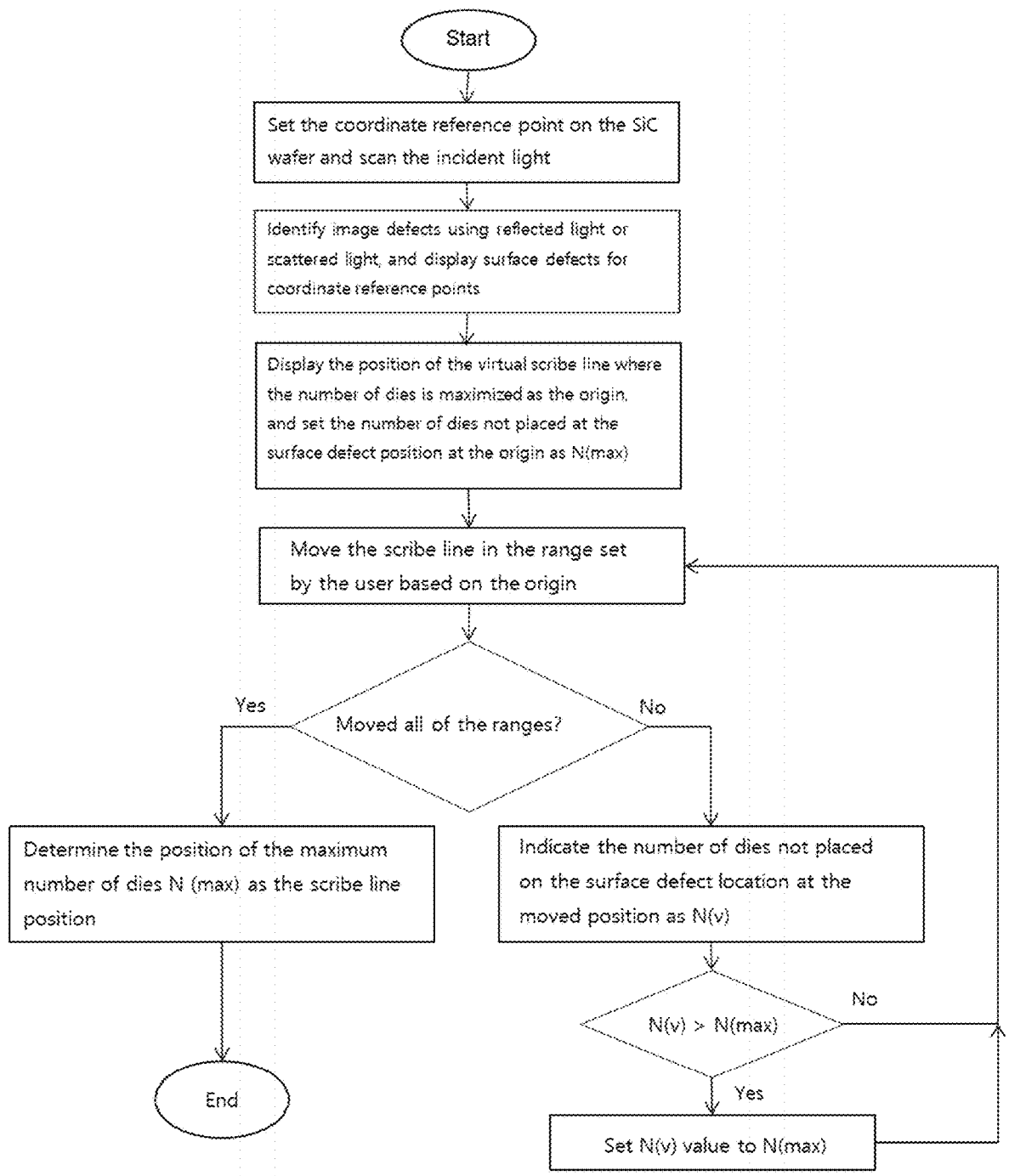
FIG. 7 is a flowchart of a die division method to maximize the number of dies distributed to avoid detected surface defects where image defects are identified using reflected light or scattered light and are displayed as surface defects, according to an embodiment of the present invention.
Figure 8:
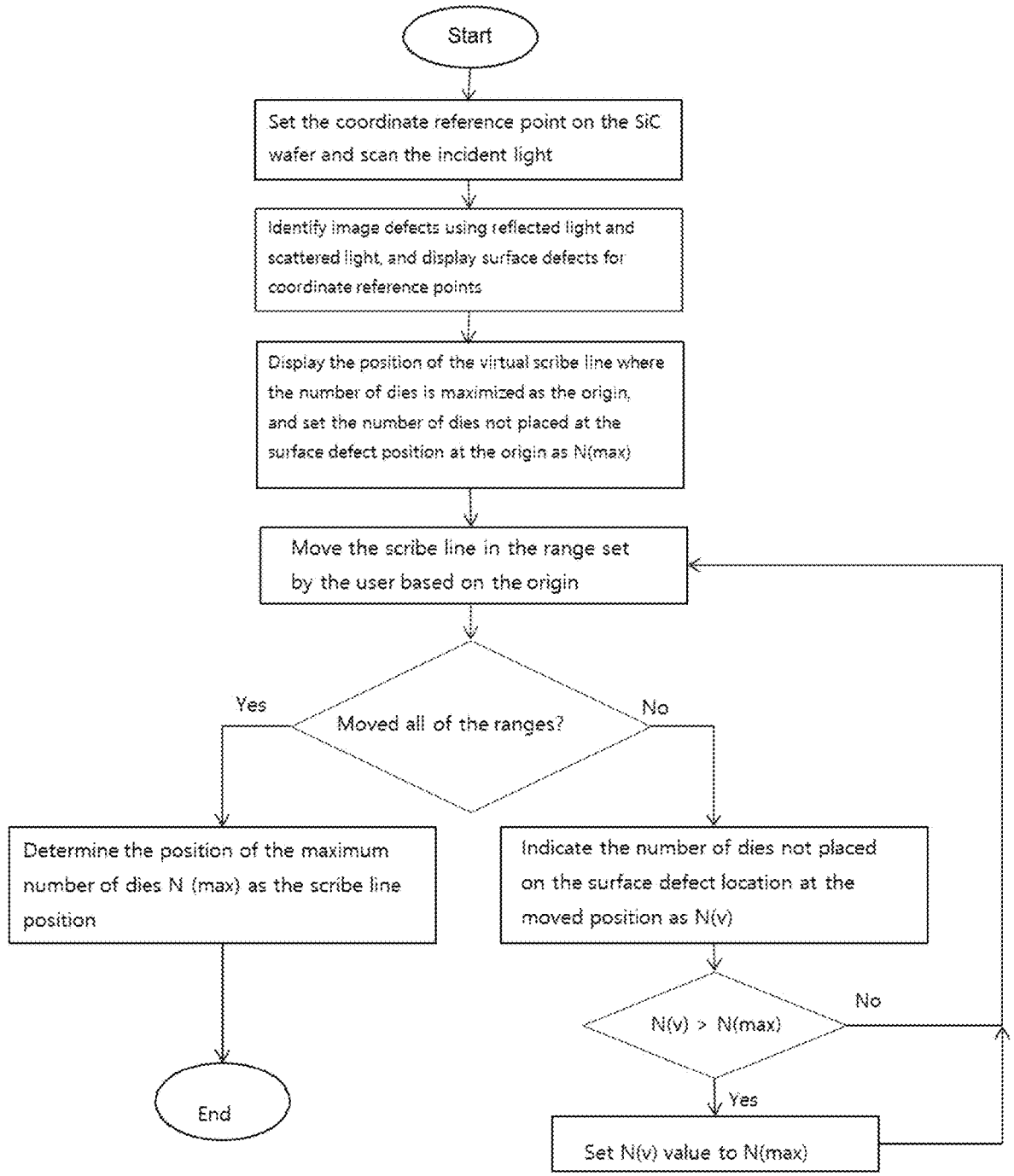
FIG. 8 is a flowchart of a die division method to maximize the number of dies distributed to avoid detected surface defects where image defects are identified using reflected light and scattered light and are displayed as surface defects, according to an embodiment of the present invention.

FIG. 7 is a flowchart of a die division method to maximize the number of dies distributed to avoid detected surface defects where image defects are identified using reflected light or scattered light and are displayed as surface defects, according to an embodiment of the present invention. And, FIG. 8 is a flowchart of a die division method to maximize the number of dies distributed to avoid detected surface defects where image defects are identified using reflected light and scattered light and are displayed as surface defects, according to an embodiment of the present invention.

Figure 9:
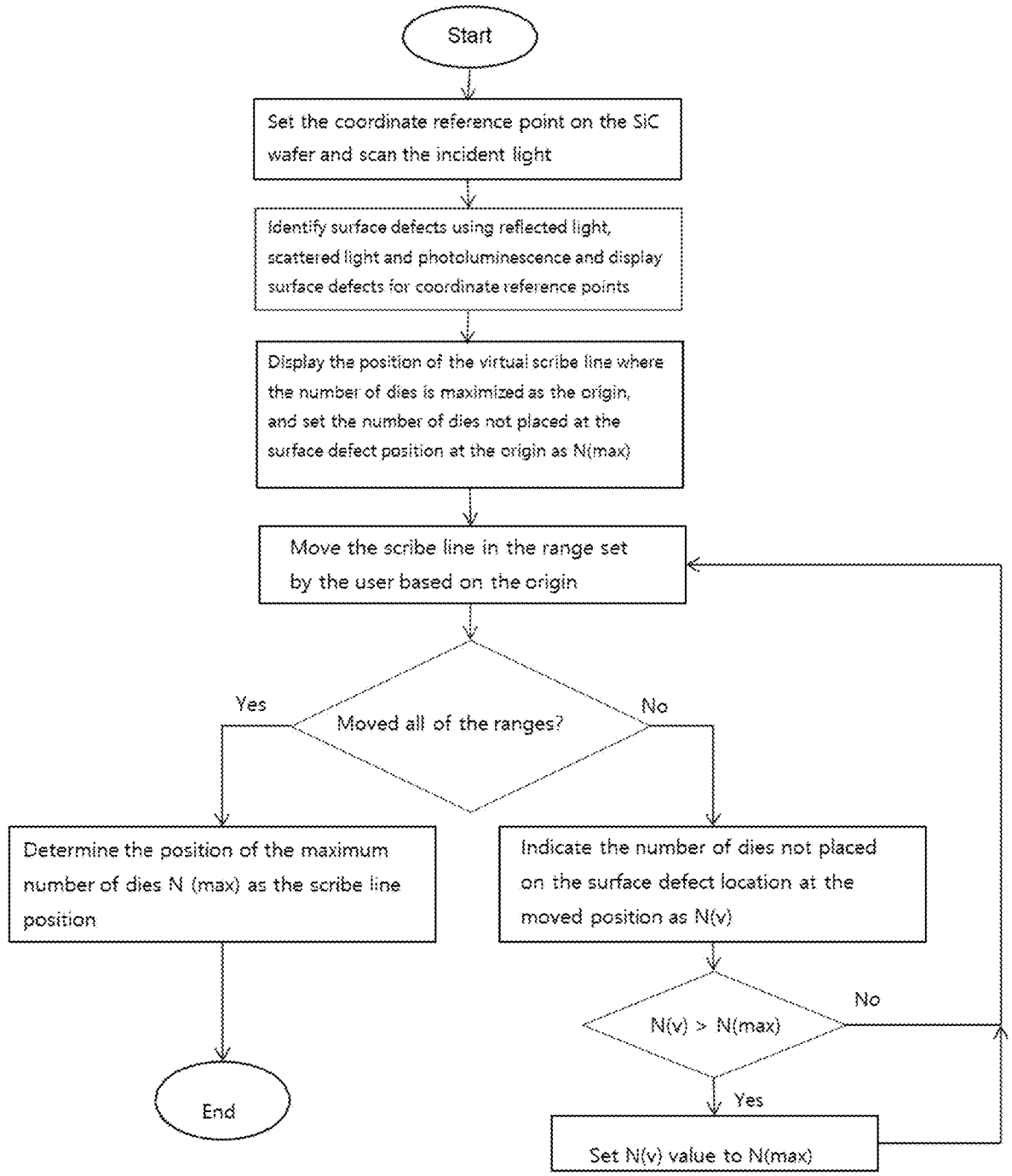
FIG. 9 is a flowchart of a die division method to maximize the number of dies distributed to avoid detected surface defects where image defects are identified using reflected light or scattered light, and additionally PL defects are identified using PL. The image defects and PL defects are displayed as surface defects according to an embodiment of the present invention.
Figure 10:
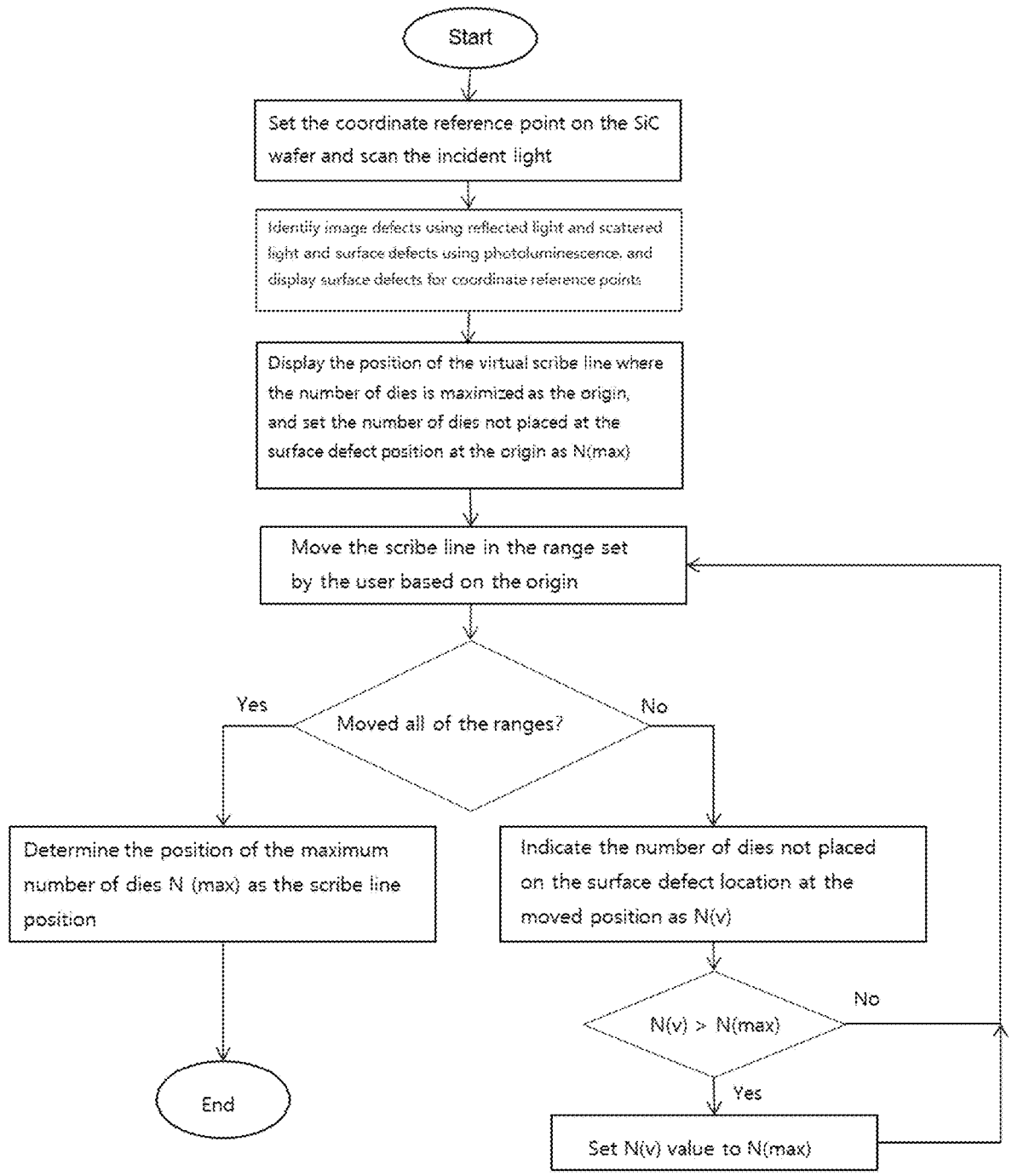
FIG. 10 is a flowchart of a die division method to maximize the number of dies distributed to avoid detected surface defects where image defects are identified using reflected light, scattered light and additionally PL, and the image defects are displayed as surface defects, according to an embodiment of the present invention.

FIG. 9 is a flowchart of a die division method to maximize the number of dies distributed to avoid detected surface defects where image defects are identified using reflected light or scattered light, and additionally PL defects are identified using PL. The image defects and PL defects are displayed as surface defects according to an embodiment of the present invention. And, FIG. 10 is a flowchart of a die division method to maximize the number of dies distributed to avoid detected surface defects where image defects are identified using reflected light, scattered light and additionally PL, and the image defects are displayed as surface defects, according to an embodiment of the present invention. In embodiments of the present invention, the moving a lattice-shaped virtual scribe line dividing the die on the surface of the wafer in a plane for adjusting the number of dies not placed at the surface defect location to be maximized, further comprises: displaying a position of a virtually displayed scribe line at which the number of dies divided on the wafer is maximized as an origin; setting the number of dies not placed at the surface defect position as the origin value when the virtually displayed scribe line is at the origin; comparing the number of dies not placed at the surface defect location with the origin value with moving the virtually displayed scribe line to a predetermined range based on the origin value with respect to the surface defect coordinate information; and determining a position, where the number of dies not placed at the surface defect position is maximum through the comparison, as the position of the scribe line. In embodiments of the present invention, the moving direction is x and y directions, which are horizontal and vertical directions of the die, and the predetermined range is a horizontal length of one die in the x direction, and a vertical length of one die in the y direction.

In order to implement the defect avoiding die division method according to embodiments of the present invention, an inspection apparatus for avoiding defects locations on wafer that detects defects on the surface of a silicon carbide wafer or an epitaxial layer formed on a silicon carbide wafer and determines die section to maximize the number of dies distributed to avoid the detected surface defects is provided. The inspection apparatus for avoiding defects locations on wafer comprises: a wafer stage for loading by setting a coordinate reference point on a surface of a silicon carbide wafer; an incident light source for incidence of incident light to the wafer surface, having a predetermined beam cross-sectional size and wavelength; a wafer stage that sets and loads a coordinate reference point on the surface of the wafer so that the incident light is scanned along a trajectory on the surface of the silicon carbide wafer and moves in two or more axes; a light condensing unit comprising a band pass filter for condensing and passing reflected light reflected from the wafer surface; a detection unit for detecting reflected light passing through the condensing unit; and a control unit for displaying an image defects as the surface defect coordinate information which is the location information of the surface defect of the wafer to the coordinate reference point of the wafer with identification of an image defect from the reflected light detected by the detection unit, for forming a lattice-shaped virtual scribe line dividing the die on the surface of the wafer, and for adjusting the number of dies not placed at the surface defect location to be maximized.

In one embodiment of the present invention, in order to include the PL defect through the photoluminescence detection in the surface defect, the condensing unit further comprises a bandpass filter for condensing and passing photoluminescence generated from the wafer, the detection unit further comprises a photoluminescence detector, the control unit further displays a PL defects as the surface defect coordinate information, which is the location information of the surface defect of the wafer to the coordinate reference point of the wafer, after identification of the PL defect from the photoluminescence detected by the detection unit. In one embodiment of the present invention, the incident light is a laser light having an energy greater than a band gap energy of the silicon carbide capable of generating photoluminescence.

In one embodiment of the present invention, in order to include the image defects through the scattered light detection in the surface defect, the incident light source unit is composed of two incident lights each incident on the wafer surface in a vertical and oblique direction, the detection unit further comprises a scattered light detector for detecting the scattered light scattered from the wafer surface, the control unit further displays a scattered light image defects as the surface defect coordinate information, which is the location information of the surface defect of the wafer to the coordinate reference point of the wafer, after identification of the scattered image defects from the scattered light detected by the detection unit.

In order that the inspection apparatus according to embodiments of the present invention can determine the die section to maximize the number of dies distributed avoiding surface defects, the control unit comprises a computer-operable program for maximizing the number of dies divided by the scribe line not placed at the surface defect position, the program comprises: operation of displaying a position of a virtually displayed scribe line at which the number of dies divided on the wafer is maximized as an origin; operation of setting the number of dies not placed at the surface defect position as the origin value when the virtually displayed scribe line is at the origin; operation of comparing the number of dies not placed at the surface defect location with the origin value with moving the virtually displayed scribe line to a predetermined range based on the origin value with respect to the surface defect coordinate information; and operation of determining a position, where the number of dies not placed at the surface defect position is maximum through the comparison, as the position of the scribe line. In one embodiment of the present invention, the moving direction is x and y directions, which are horizontal and vertical directions of the die, and the predetermined range is a horizontal length of one die in the x direction, and a vertical length of one die in the y direction. Also, in one embodiment of the present invention, the coordinate reference point is determined as the center position of the flat zone of the wafer, and the die dividing position is determined as a scribe line position, where the number of dies not placed at the surface defect location is maximized.

In one embodiment of the present invention, the control unit is capable of outputting the adjusted scribe line information to an information storage device or a wired/wireless information transmission device to deliver to a subsequent semiconductor processing equipment, and the adjusted scribe line information is the number of dies not placed at the surface defect location is maximized.

Figure 11:
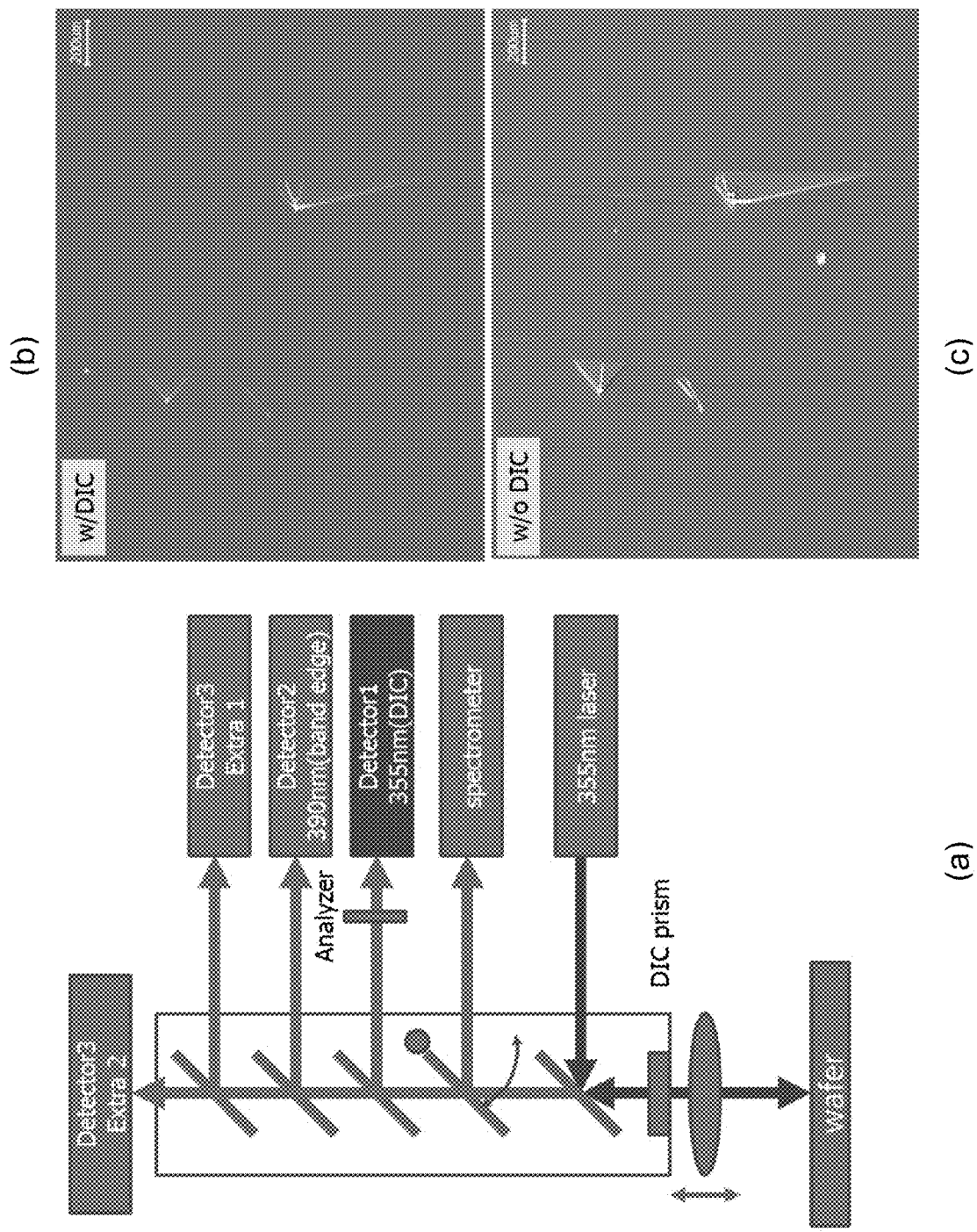
FIG. 11 is a conceptual diagram of an inspection apparatus for avoiding defects locations on wafer and a reflection image according to another embodiment of the present invention.

FIG. 11 is a conceptual diagram of an inspection apparatus for avoiding defects locations on wafer (a), a reflection image (b) and a differential interference microscope image (c) according to another embodiment of the present invention. In one embodiment of the present invention, the incident light of the incident light source has a polarization characteristic, wherein in the apparatus, a differential interference prism is further inserted in the path before the incident light passes through the objective lens for incidence of the incident light onto the wafer surface, and a polarizer is further arranged on the path in front of the detection unit. This constitutes a differential interference microscope in order to increase the detection power for surface steps.

Figure 12:
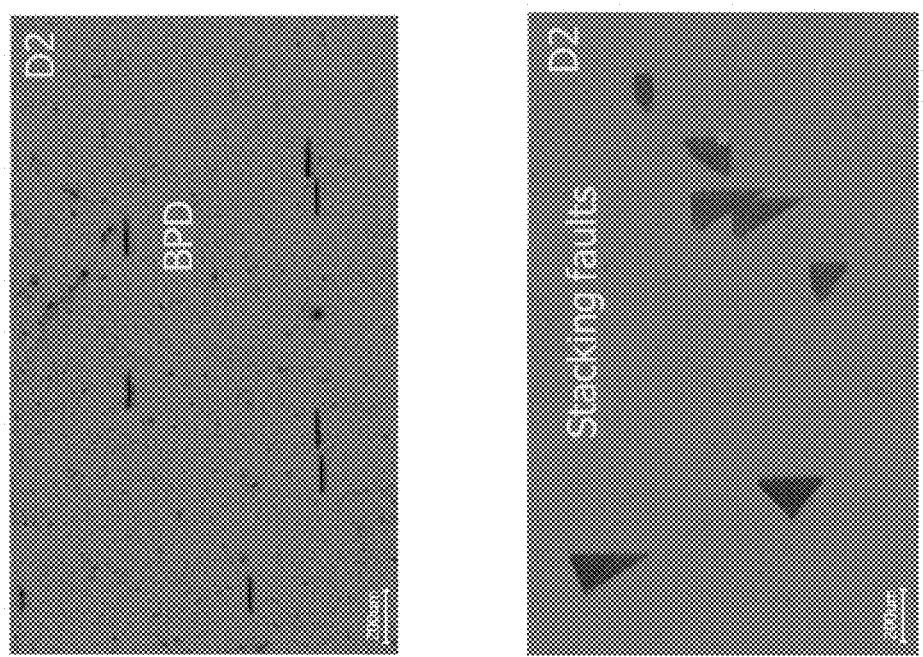
FIG. 12 is a conceptual diagram of an inspection apparatus for avoiding defects locations on wafer, a reflection image and a PL image according to another embodiment of the present invention.
Figure 12:
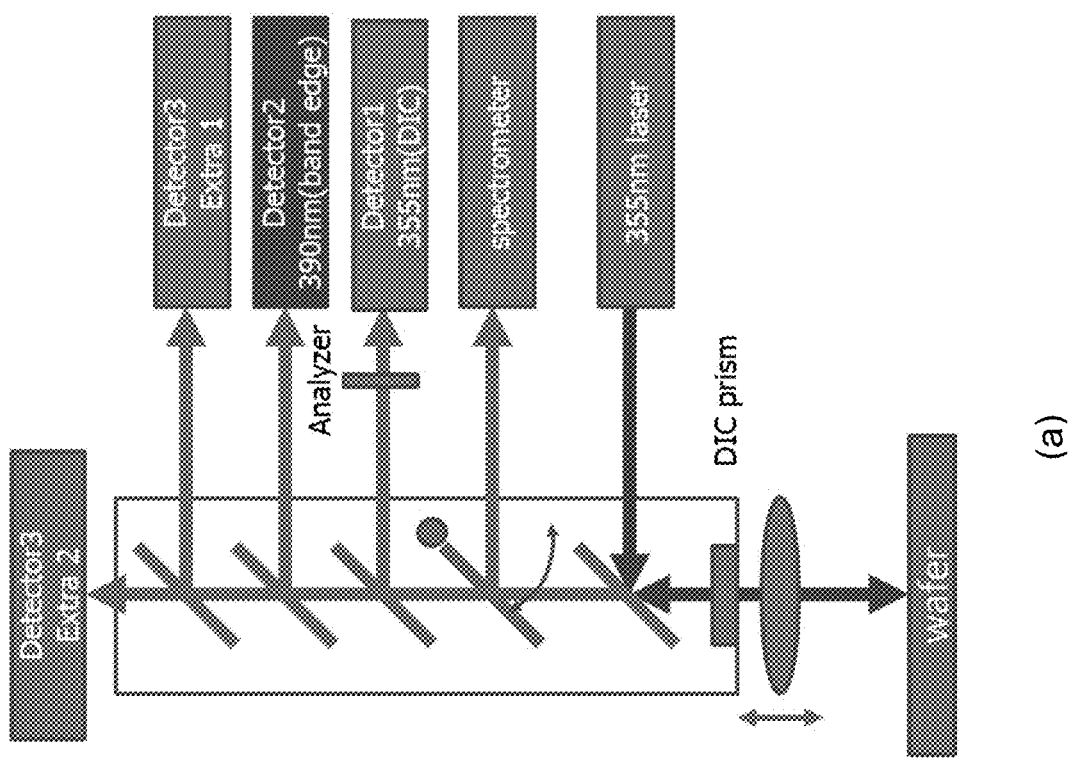

FIG. 12 is a conceptual diagram of an inspection apparatus for avoiding defects locations on wafer (a), a reflection image and a PL image (b) according to another embodiment of the present invention. In one embodiment of the present invention, the device is configured as a detector through a NUV bandpass filter centered at approximately 390 nm for sending light near the energy band gap to the detector. FIG. 12(b) shows PL images acquired by the PL detector D2, showing internal defects of a basal plane dislocation (BPD) and stacking faults (SF).

Figure 13:
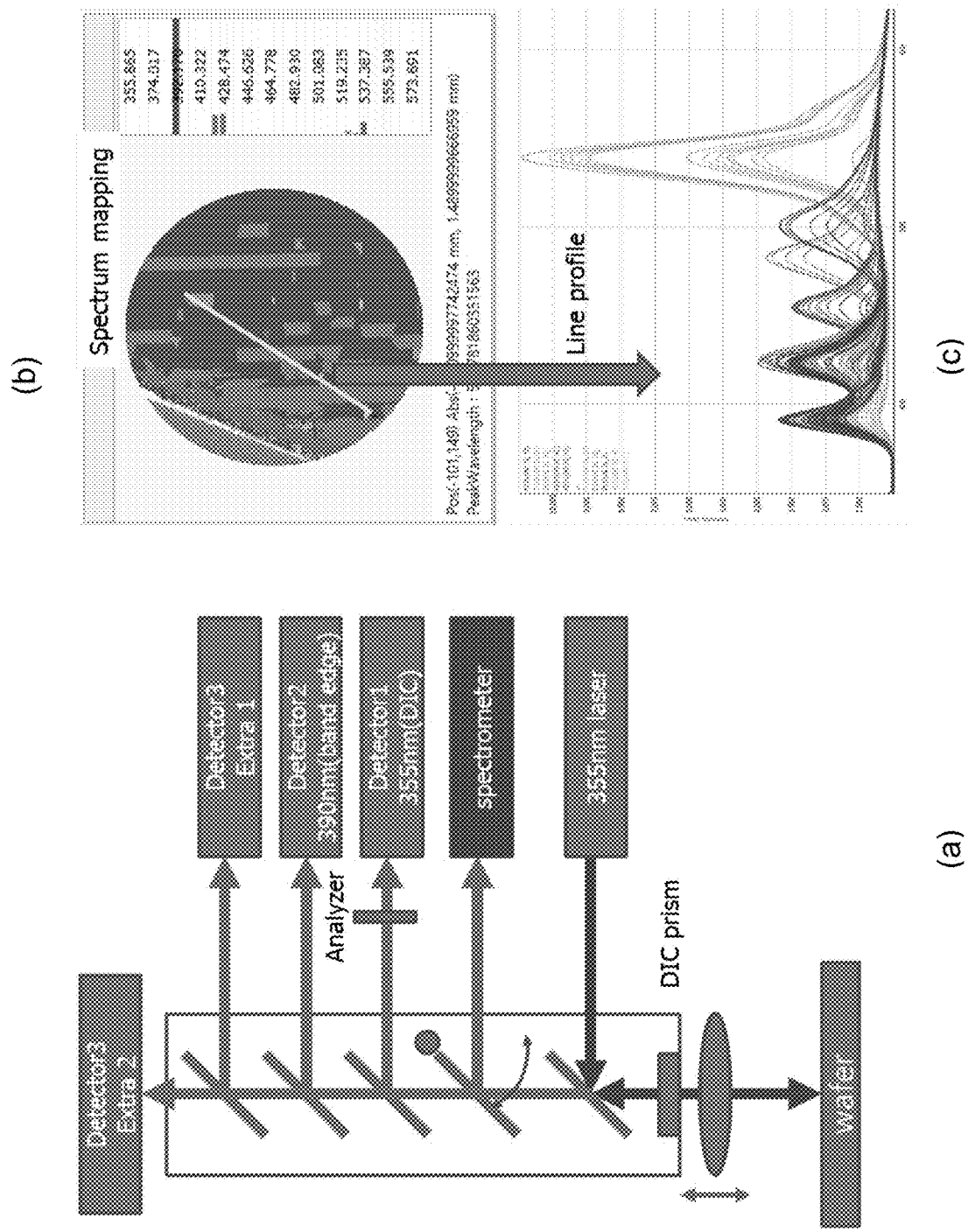
FIG. 13 is a conceptual diagram of an inspection apparatus for avoiding defects locations on wafer, a spectroscopic image according to another embodiment of the present invention.

FIG. 13 is a conceptual diagram of an inspection apparatus for avoiding defects locations on wafer (a), a spectroscopic image (b) and spectrum (c) according to another embodiment of the present invention. In one embodiment of the present invention, the condensing unit further comprises a variable angle spectroscopic mirror, and the detection unit further comprises a spectroscopic detector to acquire the spectroscopic image. For example, in the result of mapping surface defects using reflection and PL images, when strict analysis is performed through the spectral characteristics of a specific area, if a location in the mapping is determined with a mouse, etc., spectral mapping for the surrounding area mapping and show the result. FIG. 13(c) shows the result of spectral mapping and the spectral characteristics of a line profile of one area.

An inspection apparatus, comprising a reflected light and/or scattered light detector and a photoluminescence detector, further comprises a differential interference prism shown in FIG. 11 to FIG. 13. The inspection apparatus may be implemented by the control unit using an algorithm or work command in which the defect avoidance die division method described in embodiments of the present invention is implemented as a program. In the above example equipment, the additional detector ports are indicated in two increments to allow random selection of detectors, but the number may be one or three or more. As an example, the incident light is selected as 355 nm, and eight detectors can be installed so that the detectors can correspond wavelength bands of 355 nm, 390 nm, 420 nm, 455 nm, 480 nm, 500 nm, 540 nm and 750 nm. The detectors may be selected in any number.

Embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

In the above, embodiments of the present application have been described in detail. The scope of the present application is not limited thereto, and various modifications and improvements of those skilled in the art using the basic concept of the present application defined in the following claims also belong to the scope of the present application.

All technical terms used in the present disclosure, unless otherwise defined, are used in the same meaning as those of ordinary skill in the art generally understand in the related field of the present invention. The contents of all publications referred to herein by reference are incorporated into the present disclosure.

DETAILED DESCRIPTION OF MAIN ELEMENTS

10. Incident light source
20. Wafer Stage
30. Light condensing unit
41, 42, 43, 44. Detection unit
50. Control unit
100. Incident light
101, 102, 103, 104 Wafer surface generated light
320. Reflective mirror
310, 321, 322, 323. Color sorting mirror
331, 332, 333. 334 bandpass filter
340, 341, 342, 343, 344. Lens
350. Spectroscopic detector

What is claimed is:
1. Defect avoiding die division method that detects defects on a surface of a silicon carbide wafer or an epitaxial layer formed on a silicon carbide wafer, and determines a die section to maximize a number of dies distributed to avoid the detected surface defects, the defect avoiding die division method comprising:

preparing a silicon carbide wafer and setting a coordinate reference point on the surface of the silicon carbide wafer;

displaying an image defects as the surface defect coordinate information, which is a location information of the surface defect of the silicon carbide wafer to the coordinate reference point of the silicon carbide wafer, incident light having a predetermined cross-sectional beam size and wavelength is scanned onto the silicon carbide wafer surface to detect a reflected light reflected from the silicon carbide wafer surface, and the image defects are identified from the detected reflected light;

moving a lattice-shaped virtual scribe line dividing the die on the surface of the silicon carbide wafer in a plane, and adjusting the number of dies not placed at the surface defect location to be maximized comprising:

displaying a position of a virtually displayed scribe line at which the number of dies divided on the silicon carbide wafer is maximized as an origin;

setting the number of dies not placed at the surface defect position as the origin value when the virtually displayed scribe line is at the origin;

comparing the number of dies not placed at the surface defect location with the origin value with moving the virtually displayed scribe line to a predetermined range based on the origin value with respect to the surface defect coordinate information; and determining a position, where the number of dies not placed at the surface defect position is maximum through the comparison, as the position of the scribe line.

2. The defect avoiding die division method of claim 1, wherein the displaying the surface defect coordinate information further comprises detecting photoluminescence generated by scanning the incident light onto the silicon carbide wafer surface, identifying PL defect in the detected photoluminescence and displaying it in the surface defect information.

3. The defect avoiding die division method of claim 1, wherein the incident light is a laser light having an energy greater than the band gap energy of the silicon carbide wafer.

4. The defect avoiding die division method of claim 1, wherein the incident light is composed of two incident light in a vertical and oblique direction to the silicon carbide wafer surface respectively, and wherein the method further comprises detecting a reflected light reflected from the silicon carbide wafer surface and identifying scattering defect in the detected reflected light.

5. The defect avoiding die division method of claim 1, wherein moving directions are x and y directions, which are horizontal and vertical directions of the die, and the predetermined range is a horizontal length of one die in the x direction, and a vertical length of one die in the y direction.

6. The defect avoiding die division method of claim 1, wherein the coordinate reference point is determined as a center position of a flat zone of the silicon carbide wafer, and the die dividing position is determined as a scribe line position, where the number of dies not placed at the surface defect location is maximized.

* * * * *